United States Patent
Koehl et al.

(10) Patent No.: US 7,943,489 B2
(45) Date of Patent: May 17, 2011

(54) BONDED WAFER ASSEMBLY SYSTEM AND METHOD

(75) Inventors: Daryl Ross Koehl, Garland, TX (US); Braden Peter D'Andrea, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 230 days.

(21) Appl. No.: 12/238,038

(22) Filed: Sep. 25, 2008

(65) Prior Publication Data

US 2010/0075482 A1   Mar. 25, 2010

(51) Int. Cl.
*H01L 21/00* (2006.01)

(52) U.S. Cl. .......... 438/460; 257/E21.214; 225/94; 225/96; 225/97

(58) Field of Classification Search .......... 438/460; 257/E21.214; 225/2, 94–97
See application file for complete search history.

(56) References Cited

U.S. PATENT DOCUMENTS

| | | | |
|---|---|---|---|
| 4,850,780 A | 7/1989 | Safabakhsh et al. | |
| 5,524,765 A | 6/1996 | Gutentag | |
| 5,950,070 A * | 9/1999 | Razon et al. | 438/113 |
| 5,953,590 A | 9/1999 | Piper et al. | |
| 6,413,150 B1 * | 7/2002 | Blair | 451/41 |
| 7,135,385 B1 | 11/2006 | Patwardhan et al. | |
| 7,169,685 B2 | 1/2007 | Connell et al. | |
| 7,306,975 B2 * | 12/2007 | Harris, Jr. | 438/113 |
| 7,378,293 B2 | 5/2008 | Diep | |
| 2002/0178567 A1 | 12/2002 | Farnworth et al. | |
| 2004/0129451 A1 | 7/2004 | Wachtler | |
| 2005/0059188 A1 | 3/2005 | Bolken et al. | |
| 2005/0093170 A1 | 5/2005 | Kalidas et al. | |
| 2005/0202651 A1 | 9/2005 | Akram | |
| 2006/0286707 A1 | 12/2006 | Hooper et al. | |
| 2007/0035807 A1 | 2/2007 | DiCarlo et al. | |
| 2008/0014720 A1 * | 1/2008 | Tyler | 438/462 |

* cited by examiner

*Primary Examiner* — Tom Thomas
*Assistant Examiner* — Monica D Harrison
(74) *Attorney, Agent, or Firm* — Charles A. Brill; Wade James Brady, III; Frederick J. Telecky, Jr.

(57) ABSTRACT

A system and method for the removal of superfluous material in a bonded wafer assembly. The method includes cutting a plurality of parallel cuts in a top wafer, the plurality of cuts defining a segment of the top wafer attached to another portion of the top wafer via a tab, inserting a wedge-shaped breaker bar into at least one cut of the plurality of cuts, applying force to the breaker bar to fracture the tab, and removing the segment of the top wafer from the bonded wafer assembly, wherein a bottom wafer remains unsingulated after the removing.

20 Claims, 8 Drawing Sheets

BONDED WAFER ASSEMBLY SYSTEM AND METHOD

CROSS-REFERENCE TO RELATED APPLICATIONS

This application is related to co-filed and commonly owned U.S. patent application Ser. No. 12/238,138, "MEMS Device and Fabrication Method," which application is hereby incorporated herein by reference.

TECHNICAL FIELD

Embodiments of the present invention relate to a system and method for a bonded wafer assembly, and more particularly to a system and method for removing superfluous material from a MEMS bonded wafer assembly.

BACKGROUND

In the production of semiconductors, and particularly in the production of microelectromechanical system (MEMS) devices, chips are produced in an array often times having as many 30 or more devices on a single wafer. Typically, these devices are formed on a first wafer, and then a second wafer is bonded to the first wafer. Cavities may be formed between the wafers in various areas, for example above the MEMS components or above the bond pads. After the wafers are bonded together, the bond pads, or other structures to which access is desired for further testing and processing, are completely covered by the top wafer. These structures generally need to be exposed prior to testing and processing of the embedded devices.

Previously, singulation of these devices was performed to separate the devices from each other and expose the bond pads prior to the testing and processing of the devices. In previous methods, the wafer assembly would be completely singulated into individual devices, and the individual devices would be arranged and held in place on a tape for testing and processing. The devices may be singulated either before or after being placed on the tape.

The use of a tape in such a process may give rise to various problems. In particular, the shifting of chips on the tape may cause alignment problems with a testing probe or other equipment. Such problems tend to increase test time due to extensive wafer alignment measurements, and also tend to increase the down time during testing resulting from misalignment. Both of these factors may contribute to increased cost of semiconductor production.

SUMMARY OF THE INVENTION

These and other problems are generally solved or circumvented, and technical advantages are generally achieved, by preferred embodiments in which captive structures of MEMS devices in a bonded wafer assembly are uncovered while the MEMS devices remain together, unsingulated, in the wafer assembly.

In accordance with a preferred embodiment, a method for removing material from a bonded wafer assembly comprising a top wafer bonded to a bottom wafer comprises cutting a plurality of parallel cuts in the top wafer, the plurality of cuts defining a segment of the top wafer attached to another portion of the top wafer via a tab, inserting a wedge-shaped breaker bar into at least one cut of the plurality of cuts, applying force to the breaker bar to fracture the tab, and removing the segment of the top wafer from the bonded wafer assembly, wherein the bottom wafer remains unsingulated after the removing.

In accordance with another preferred embodiment, a system for removing superfluous material from a bonded wafer assembly comprises a saw ring for holding a bonded wafer assembly comprising a top wafer and a bottom wafer, wherein the top wafer has a plurality of parallel cuts formed therein, and wherein the bottom wafer is unsingulated, and a breaker bar having a wedge profile shaped to be inserted at least one cut of the plurality of cuts.

In accordance with another preferred embodiment, a method for removing material from a bonded wafer assembly comprising a top wafer bonded to a bottom wafer comprises mounting the bonded wafer assembly in a saw ring, wherein the saw ring has a height higher than the lower wafer and lower than a top surface of the top wafer, cutting a plurality of parallel cuts in the top wafer, the plurality of cuts defining a segment of the top wafer attached to another portion of the top wafer via a tab, mounting the saw ring and the bonded wafer assembly in a vacuum chuck, applying a vacuum to secure the bonded wafer assembly, inserting a wedge-shaped breaker bar into at least one cut of the plurality of cuts, applying force to the breaker bar to break the tab, and removing the segment of the top wafer from the bonded wafer assembly, wherein the bottom wafer remains unsingulated after the removing.

An advantage of an embodiment is that MEMS devices may be tested and further processed without singulation of the wafer. Another advantage of an embodiment is that the alignment and cost issues of associated with previous methods may be avoided.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

Various embodiments will now be discussed in detail with reference made to the accompanying figures. It should be appreciated, however, that the present invention provides many applicable inventive concepts that can be embodied in a wide variety of specific contexts. The specific embodiments discussed herein are merely illustrative of specific ways to make and use the invention, and do not limit the scope of the invention.

The present invention will be described with respect to preferred embodiments in a specific context, namely the fabrication of a particular microelectromechanical system (MEMS) device formed on a silicon wafer with a glass cover or cover assembly that includes a glass cover wafer, as used in, for example, a digital micromirror device (DMD). The concepts may also be applied, however, to other MEMS structures and make use of other materials as well. For example, the MEMS devices may be other spatial light modulators, other optical devices such as optical switches, mechanical or electrical switches, mechanical transducers such as pressure sensors, accelerometers, piezoelectrics, gyroscopes, biosensors, chemical sensors, chemical reactors, electrostatic actuators, micro-motors, micro-relays, fluidic devices such as pneumatic valves, membrane pumps, flow sensors, etc.

With respect to DMDs, and as fully explained in commonly owned U.S. Pat. No. 7,378,293 to Diep, "MEMS Fabrication Method," issued on May 27, 2008, which patent is hereby incorporated herein by reference, DMD MEMS devices may be formed by bonding a glass cover to a semiconductor wafer containing the MEMS components, circuitry, bond pads, etc. Prior art methods for wafer singulation use a partial-saw and break method. That is, a saw cut creates a fault-line so that the dice may be separated using an impact tool. U.S. Pat. No. 7,378,293 also teaches a partial-saw and full-saw method. That is, a first saw cut is made partially into the cover, and a second saw cut is made all the way through the cover and the wafer to separate the dice. In either approach, singulation of the wafer assembly into individual dice is followed by removal of the swizzle sticks (in these examples the portion of the cover that is covering the bond pads) to expose the bond pads. Testing and further processing of the dice then may be performed. Further details for DMD device structures, applications, and processes (e.g., sawing and glass removal) may be referenced in U.S. Pat. No. 7,378,293, and thus are not described herein in detail except to the extent helpful in clarifying the described embodiments.

Figure 1:
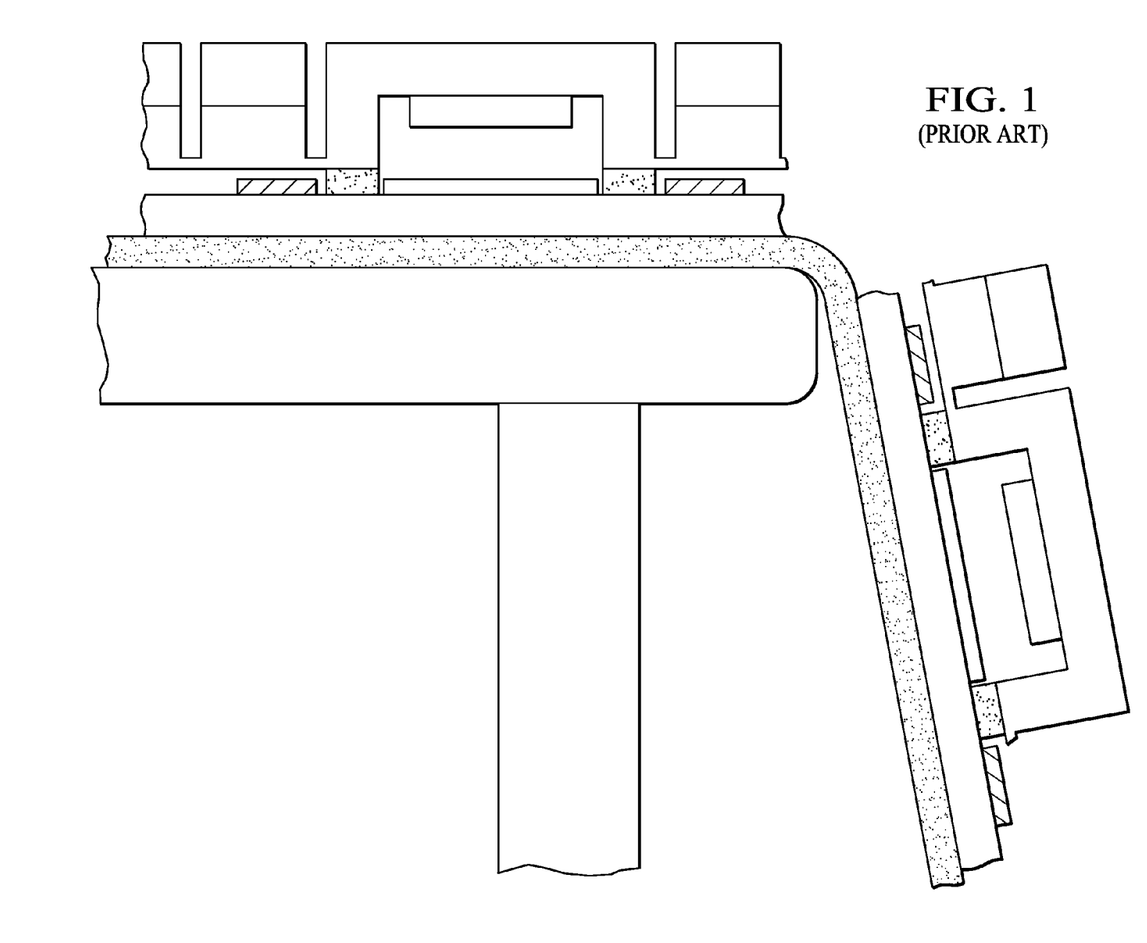
FIG. 1 illustrates a prior art method of wafer singulation.

FIG. 1 illustrates one prior art method of singulating a wafer and gaining access to the bond pads during manufacture. As illustrated in FIG. 1, with the wafer assembly attached to a tape and with partial saw cuts made into the top cover assembly, the bottom wafer is broken over the edge of a flat table. The individual swizzle sticks are individually pressed to snap the remaining glass and remove the stick. After the swizzle stick removal process is completed for the entire wafer, the singulated die are transferred to a new tape on another saw frame. While this method permits access to the bond pads disposed beneath the excess material, it is susceptible to subsequent alignment problems due to the dice on the tape being fully singulated and due to multiple tape mounting steps.

Figure 2:
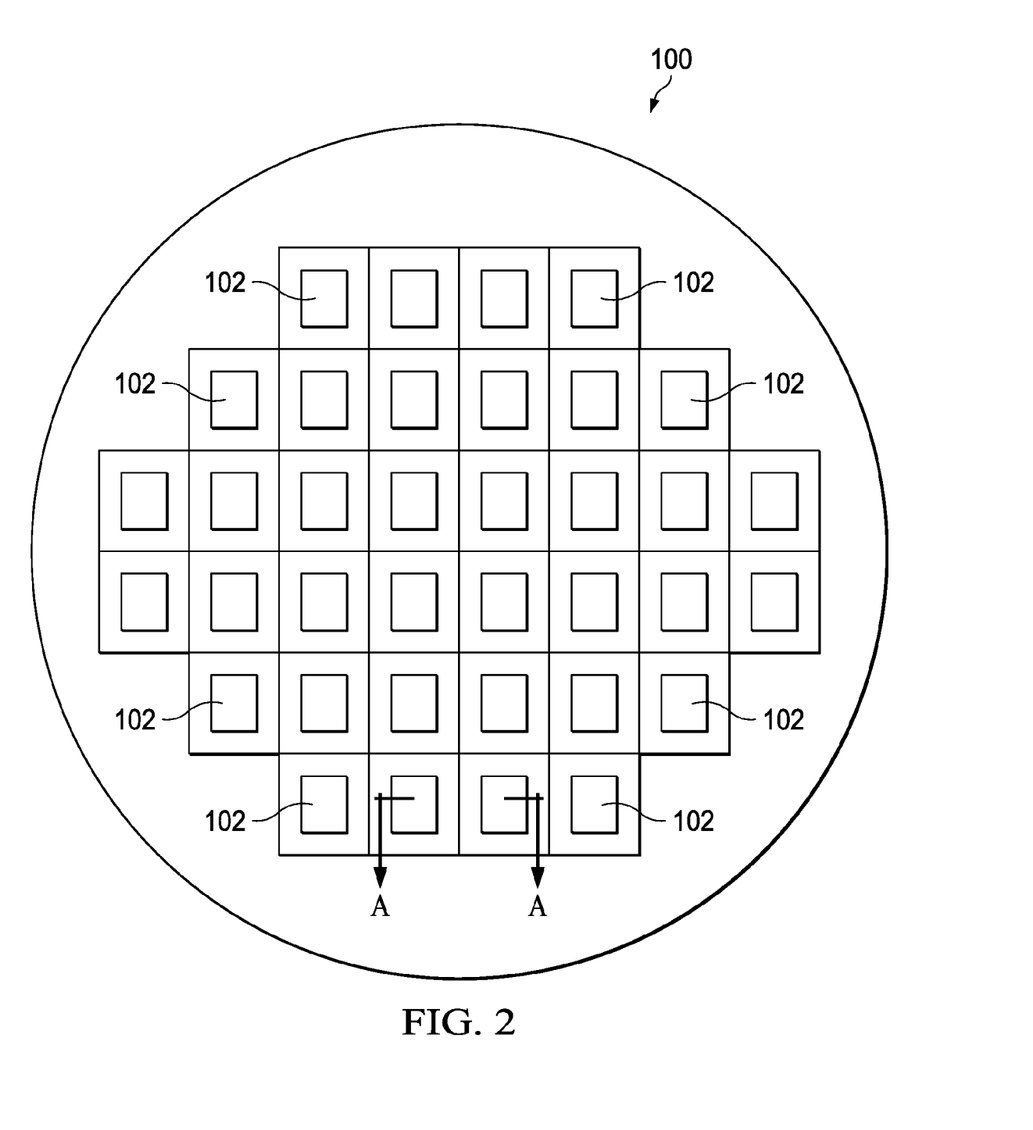
FIG. 2 is a top plan view of a bonded wafer assembly having a plurality of devices disposed thereon.

Referring now to FIG. 2, there is shown a wafer 100 populated with a plurality of devices 102. By way of example, FIG. 1 shows the wafer 100 to be populated with thirty-six devices 102. Alternatively, fewer devices may be used, or a much greater number of devices 102 may be used in other embodiments. As can be seen in FIG. 2, the arrangement of the devices 102 upon the surface of the wafer 100 creates a grid-like pattern having both horizontal rows and vertical columns. Note that only the horizontal rows are shown in the subsequent figures with the vertical columns omitted for clarity. Note also that the terms "horizontal rows" and "vertical columns" are used herein for convenience, but are arbitrarily chosen and distinguishable only relative to one another unless otherwise noted or apparent from the context.

Figure 3:
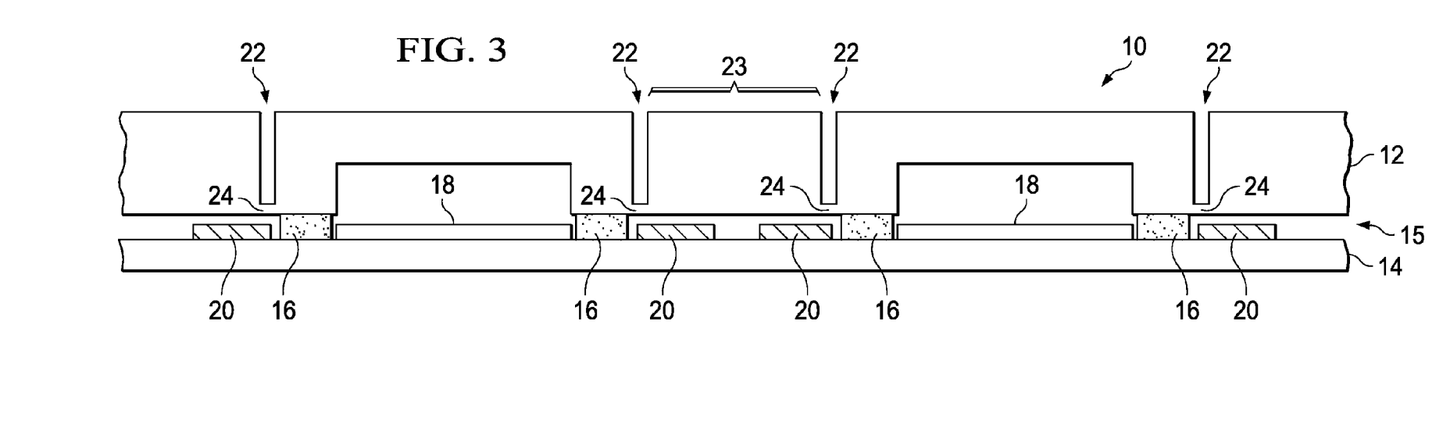
FIG. 3 is a side elevation view of the bonded wafer assembly of FIG. 2 taken along section line A-A.

Referring now to FIG. 3, there is shown a bonded wafer assembly 10 that includes a top wafer 12 and a bottom wafer 14. The top wafer 12 and the bottom wafer 14 are joined by way of a series of adhesive pads 16 disposed in an interstitial space 15. In a typical embodiment, the top wafer 12 has a thickness of approximately 1 millimeter and is constructed from an appropriate semiconductor processing material. Such a material could be, for example, glass, silicon, or gallium arsenide. Furthermore, the top wafer 12 may be of unitary construction, or may be an assembly of multiple layers or substrates. The bottom wafer 14 may also be constructed of any appropriate semiconductor material such as, for example, silicon or gallium arsenide. Also disposed in the interstitial space 15 is at least one device 18. By way of example, the device 18 is illustrated in FIG. 3 as being a MEMS type device, and in particular a DMD device. However, the device 18 may include any appropriate integrated circuit device. The device 18 typically includes a set of contact zones 20, e.g., comprising bonding pads, disposed proximate to, and on either side of, the device 18.

Referring still to FIG. 3, a first set of partial cuts 22 are made in the top wafer 12. The partial cuts 22 are typically positioned on either side of the device 18 on the outside of the adhesive pads 16. The partial cuts 22 may be made by any appropriate means such as, for example, a rotating or reciprocating saw. The partial cuts 22 generally should be formed in such a way so as to ensure that each cut has an accurate and consistent depth. The partial cuts 22 typically have a width in the range of approximately 50 microns to approximately 100 microns, although other dimensions may be used for this and the other cuts described herein. The partial cuts 22 define a segment 23 of the top wafer that will be removed to gain access to the contact zones 20. As illustrated in FIG. 3, the partial cuts 22 do not cut all the way through the top wafer 12. Rather, the partial cuts 22 only cut partially through the top wafer 12 leaving a tab 24 holding the segment 23 in place. The tab 24 typically has a thickness in the range of about 30 microns to about 80 microns, but may be other dimensions depending on the specific application. The first set of cuts 22 extend down the full length of the bonded wafer assembly 10.

Figure 4:
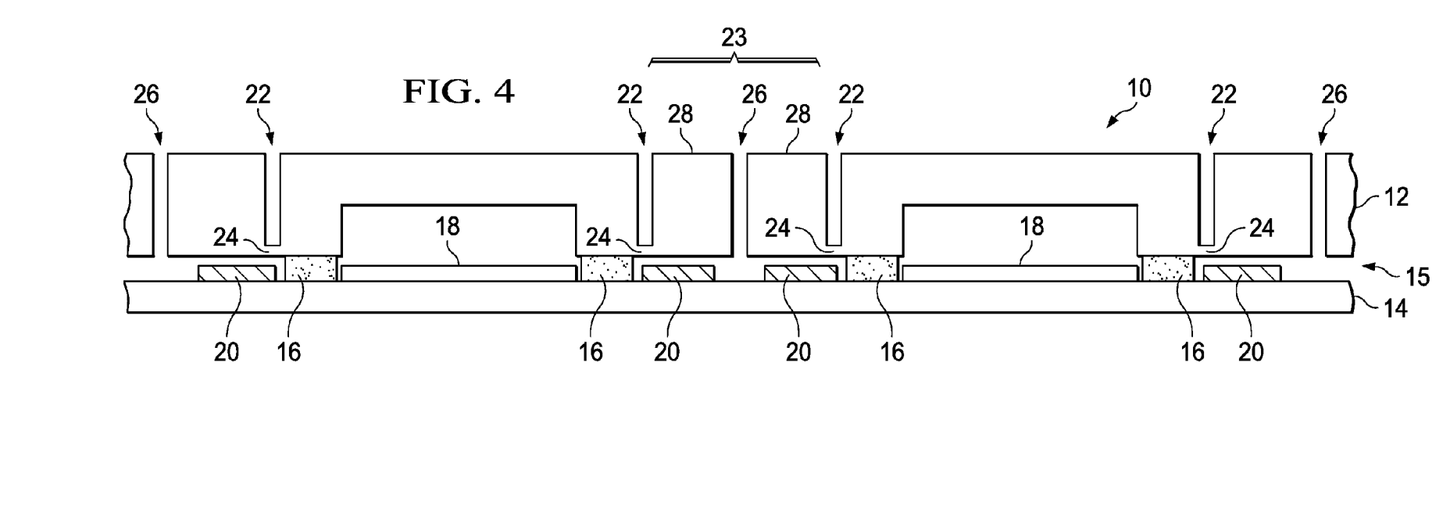
FIG. 4 is a side elevation view of the bonded wafer assembly of FIG. 3 at a subsequent step in production.

Referring next to FIG. 4, there is shown the bonded wafer assembly 10 in the next phase of manufacturing. At this point, a second set of full cuts 26 are made in the top layer 12. The complete cuts 26 extend entirely through the top wafer 12, but do not reach the bottom wafer 14, leaving the bottom layer 14 intact. Alternatively, for the complete cuts, the bottom wafer may be partially cut into, as long as the bottom wafer is not singulated. The complete cuts 26 are positioned so as to approximately bisect segment 23 into segment halves or swizzle sticks 28. Typically, each swizzle stick 28 has a width in the range of approximately 400 microns to approximately 800 microns, although other dimensions may be used depending on the application. The complete cuts 24 may be made by any of the methods contemplated hereinabove with respect to the partial cuts 24, or by any other appropriate method.

There are many alternatives for the bonded wafer assembly that may be utilized in the following embodiments. For example, during or after the formation of the complete cuts 26, the process may additionally cut through bottom wafer 14 to singulate the bottom wafer 14 into rows of attached die or into a grid of individual die. In yet another embodiment, the complete cuts 26 may be formed as partial cuts similar to the other partial cuts 22 formed in the top wafer 12. There may be a different number of cuts other than three between adjacent die. In some embodiments there may be only two partial cuts as shown in FIG. 3, or one of those cuts may be a complete cut. Alternatively there may be more than three cuts, such as four or five cuts, in any combination of partial and complete cuts.

As will be discussed in more detail in the following paragraphs, the bonded wafer assembly 10 is typically secured in a saw ring 34 (shown in FIG. 5) during the process of making the partial cuts 22 and the full cuts 26. Generally, the cuts in the top wafer may be formed in any appropriate configuration and by any appropriate method, such as the applicable methods disclosed in U.S. Pat. No. 7,378,293, or those disclosed in co-filed U.S. patent application Ser. No. 12/238,138, "MEMS Device and Fabrication Method."

Figure 5:
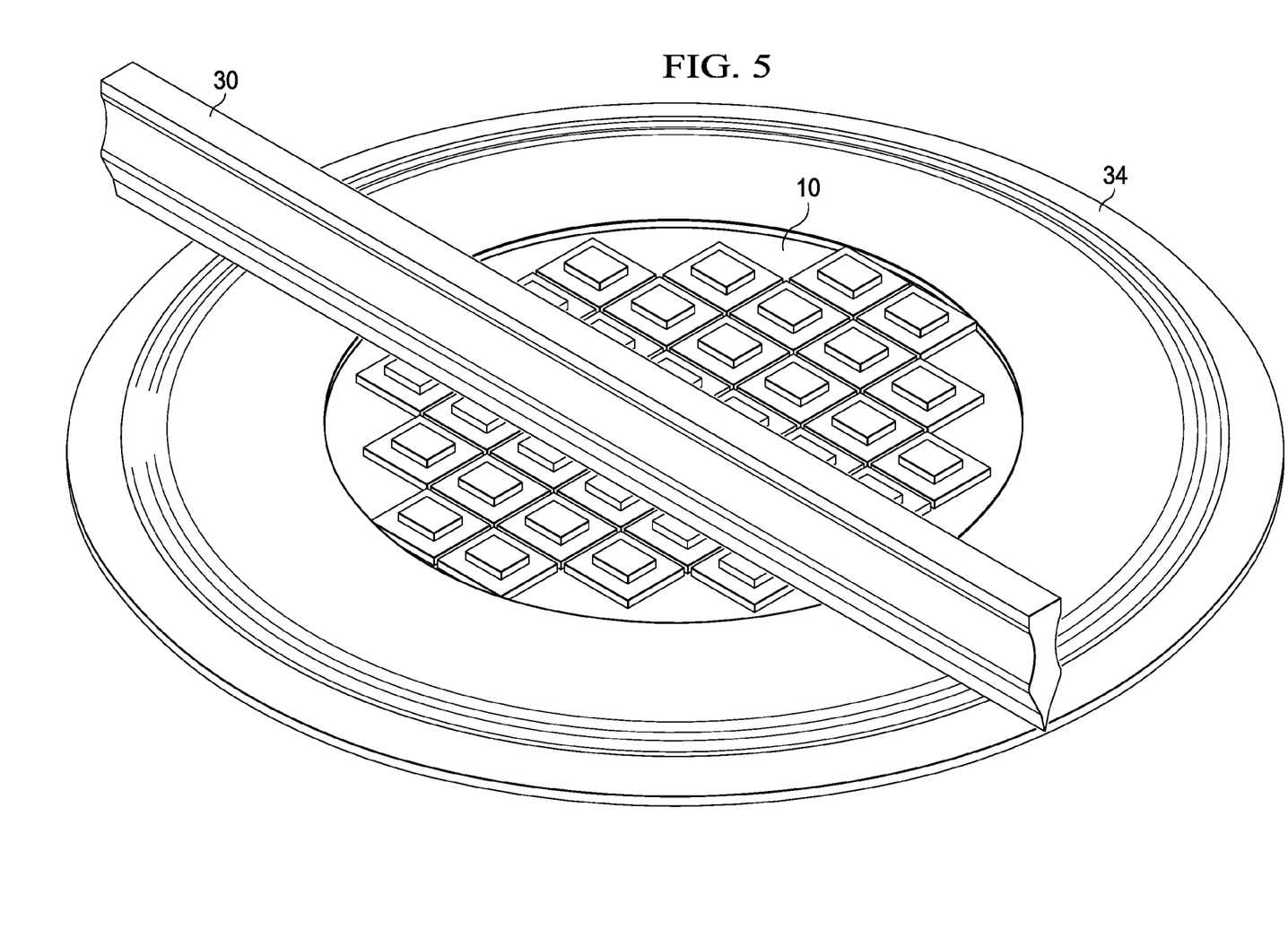
FIG. 5 is a perspective view of a bonded wafer assembly mounted onto a frame.
Figure 6A:
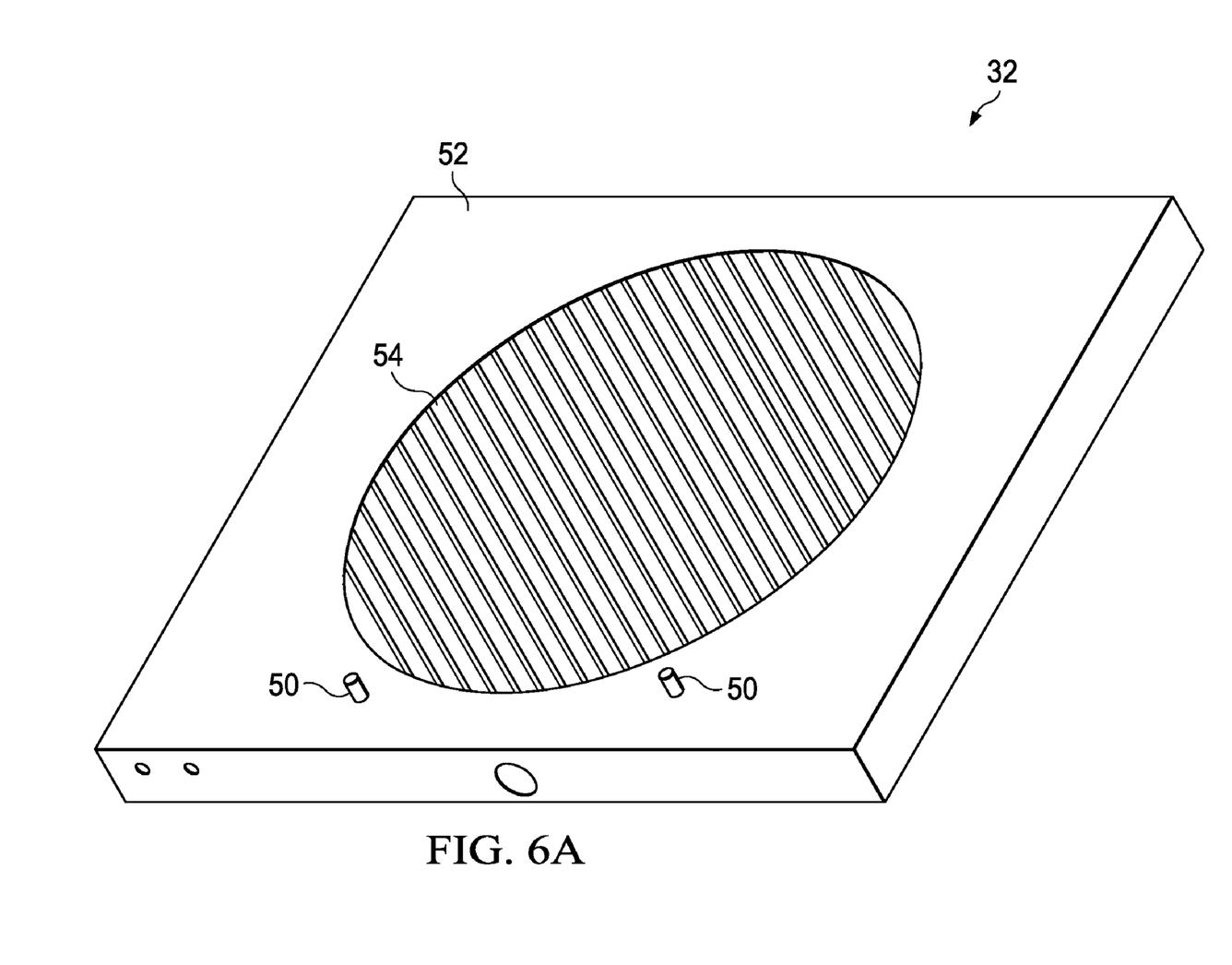
FIG. 6A is a perspective view of a vacuum chuck.

Referring now to FIGS. 4, 5 and 6A together, the bonded wafer assembly 10 is secured in a saw ring 34 (FIG. 5). The saw ring 34, holding the bonded wafer assembly 10, is mounted onto a vacuum chuck 32 (FIG. 6A). As shown in FIG. 6A, the vacuum chuck 32 includes two location pins 50 extending upwardly from a surface 52. These location pins 50 engage the saw ring 34 and hold it in place during processing. In addition, a series of vacuum channels 54 are formed in the surface 52. These vacuum channels are typically oriented at an angle of roughly 45 degrees from the rows and columns present on the bonded wafer assembly 10. This orientation ensures that no vacuum channel lines up precisely with saw cuts 22 or 26, and thus, that there is sufficient support underlying the bottom wafer 14 over the length of any given one of the saw cuts 22 and 26. Such an arrangement generally reduces the risk of damage to the bottom wafer 14. Vacuum chuck 32 is typically constructed from aluminum, but other materials, such as stainless steel or titanium, could also be used.

Figure 7:
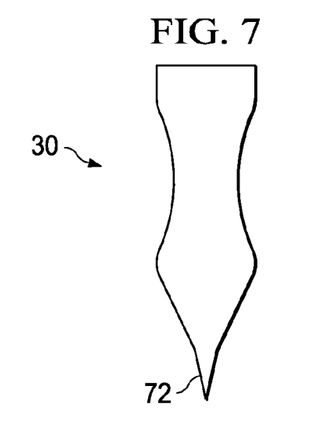
FIG. 7 is a side elevation view of a breaker bar.
Figure 8A:
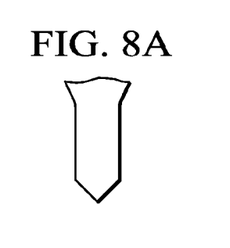
FIGS. 8A-8H illustrate various alternative geometries of the breaker bar.
Figure 8B:
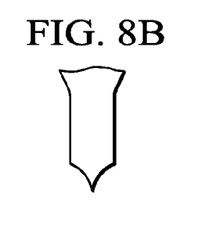
Figure 8C:
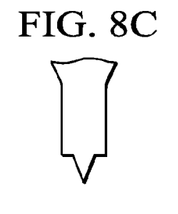
Figure 8D:
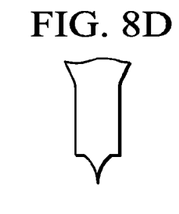
Figure 8E:
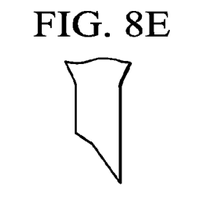
Figure 8F:
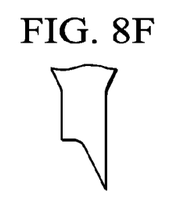
Figure 8G:
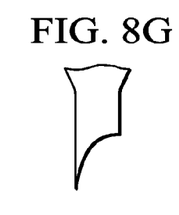
Figure 8H:
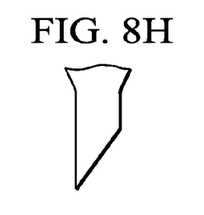

As shown in FIG. 5, a wedge fracture tool or breaker bar 30 is inserted into one of the second set of cuts 26. The cross-section of the breaker bar 30 illustrated in FIG. 7 generally has a wedge shape, although the breaker bar 30 may comprise any one of the exemplary geometries illustrated in FIGS. 8A-8H, or any other appropriate geometry. The breaker bar 30 includes a tip 72 that is generally sized and shaped to engage one of the full saw cuts 26 described hereinabove. In a typical embodiment, the breaker bar 30 is constructed of 316 stainless steel. Alternatively, other hard materials, such as other types of steels, titanium, etc., could also be used.

The progressive insertion of the breaker bar 30 into the cut 26 results in the gradual rotation of the swizzle sticks 28 about the tabs 24. The increased torque eventually induces the tab 24 to fracture thereby releasing the swizzle sticks 28. Alternatively, the breaker bar 30 may be inserted into one or both partial cuts 22 to fracture the tabs 24 to release the swizzle sticks 28. The swizzle sticks 28 are then removed from the wafer assembly 10, allowing access to the contact zones 20 for processing or testing of the devices 18. The removal of the swizzle sticks 28 may be accomplished manually, or a vacuum system could be employed to immediately remove the swizzle sticks 28 upon the fracture of the tab 24.

The geometry of the saw ring 34 and the breaker bar 30 relative to the wafer assembly 10 generally ensures that the breaker bar 30 extends far enough into the full cut 26 to break tabs 24, but does not penetrate all the way through to the bottom wafer 14. The saw ring 34 generally has a thickness in the range of approximately 1000 microns to approximately 1100 microns. The bottom wafer 14 on the saw ring 34 generally has a thickness in the range of approximately 800 microns to approximately 900 microns, leaving a gap between the breaker bar 30 and the bottom wafer 14 in the range of approximately 100 microns to approximately 300 microns.

Alternatively, the saw ring 34 could have other dimensions as needed for different thickness wafers. In addition, the breaker bar 30 could also be manufactured to have a geometry designed to interface with and use a top surface of the top wafer 12 as a stop, and thereby prevent the fracture of or damage to the bottom wafer 14. Furthermore, other methods could be used to ensure that the breaker bar 30 does not penetrate all the way through to the bottom wafer 14. For example, feet could be added to the ends of the breaker bar 30 that would engage the working surface upon reaching the desired depth. Furthermore, in an automated system, a control system could be utilized to ensure that the breaker bar 30 is not advanced beyond a predetermined depth.

Figure 6B:
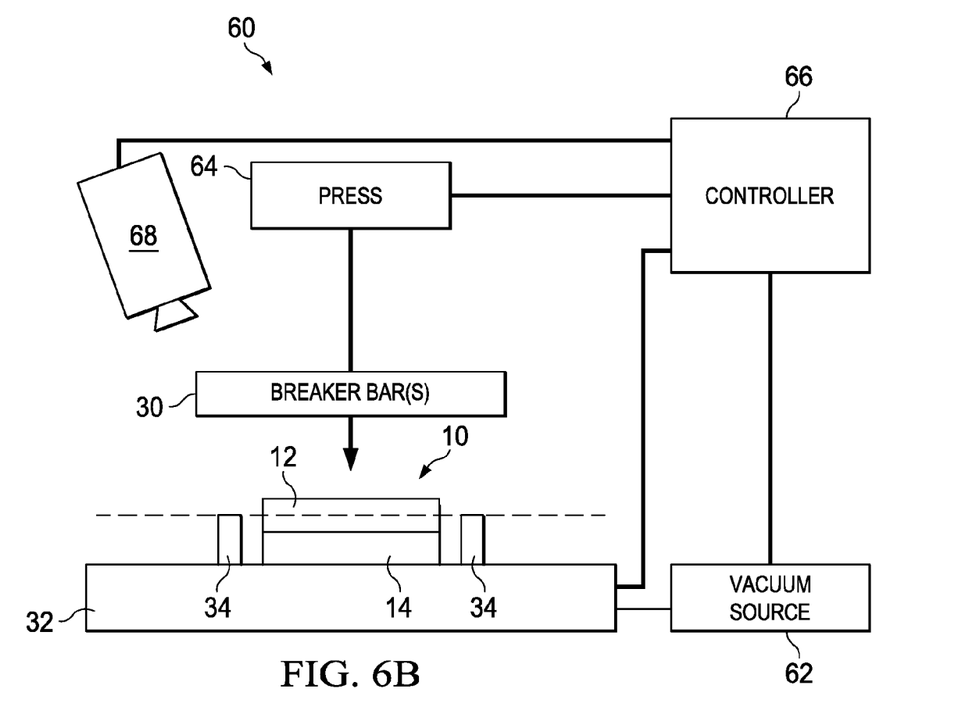
FIG. 6B is a block diagram of a system for utilizing a breaker bar on a bonded wafer assembly.

There may be a single breaker bar 30 that is used repeatedly on each cut 26, or there may be multiple breaker bars 30 used simultaneously on multiple cuts 26. The process of using the breaker bar 30 may be performed manually, or it could be automated. Referring to FIG. 6B, there is shown a system 60 for automatically removing the superfluous glass material from a bonded wafer assembly 10 using one or more breaker bars 30. Vacuum source 62 may be used to provide a vacuum to vacuum chuck 32. As can be seen in FIG. 6B, the saw ring 34 has a height that is above bottom wafer 14 but below top wafer 12. The breaker bar 30 may be mounted onto the ram of a hydraulic or pneumatic press 64 or any other appropriate device. The vacuum chuck 32, vacuum source 62 and press 64 may be controlled by controller 66. The controller may turn vacuum source 62 on to hold bonded wafer assembly 10 in place. The controller 66 may move press 64 or vacuum chuck 32 relative to each other to align breaker bar 30 with cut 26 on bonded wafer assembly 10. The controller then may control press 64 to force breaker bar 30 downward onto bonded wafer assembly 10. The controller may be programmed to stop the press 64 upon the breaker bar 30 touching the saw ring 34. Alternatively, the press may be calibrated to deliver a predetermined amount of pressure to the bonded wafer assembly 10 through the breaker bar 30. Or the press may be calibrated to stop at a predetermined height above the lower wafer 14. Once the breaker bar 30 fractures tabs 24 on upper wafer 12, the controller may control press 64 to retract breaker bar 30. If there are more cuts 26 than breaker bars 30, the controller may adjust the relative positions of the vacuum chuck 32 and the press 64 so that the breaker bar 30 is aligned with a different cut 26, and the process may be repeated. The superfluous glass may then be removed from the bonded wafer assembly 10.

The breaker bar 30 may be used as an additional process in saw, or may be a separate process by itself. In an automated operation, the press generally should be capable of delivering a controlled or maximum pressure so as to prevent damage to the bonded wafer assembly 10. Additionally, the system 60 may be equipped with a visual alignment device 68, such as a camera, so as to aide with the alignment of the breaker bar 30 with the cut 26.

Figure 9:
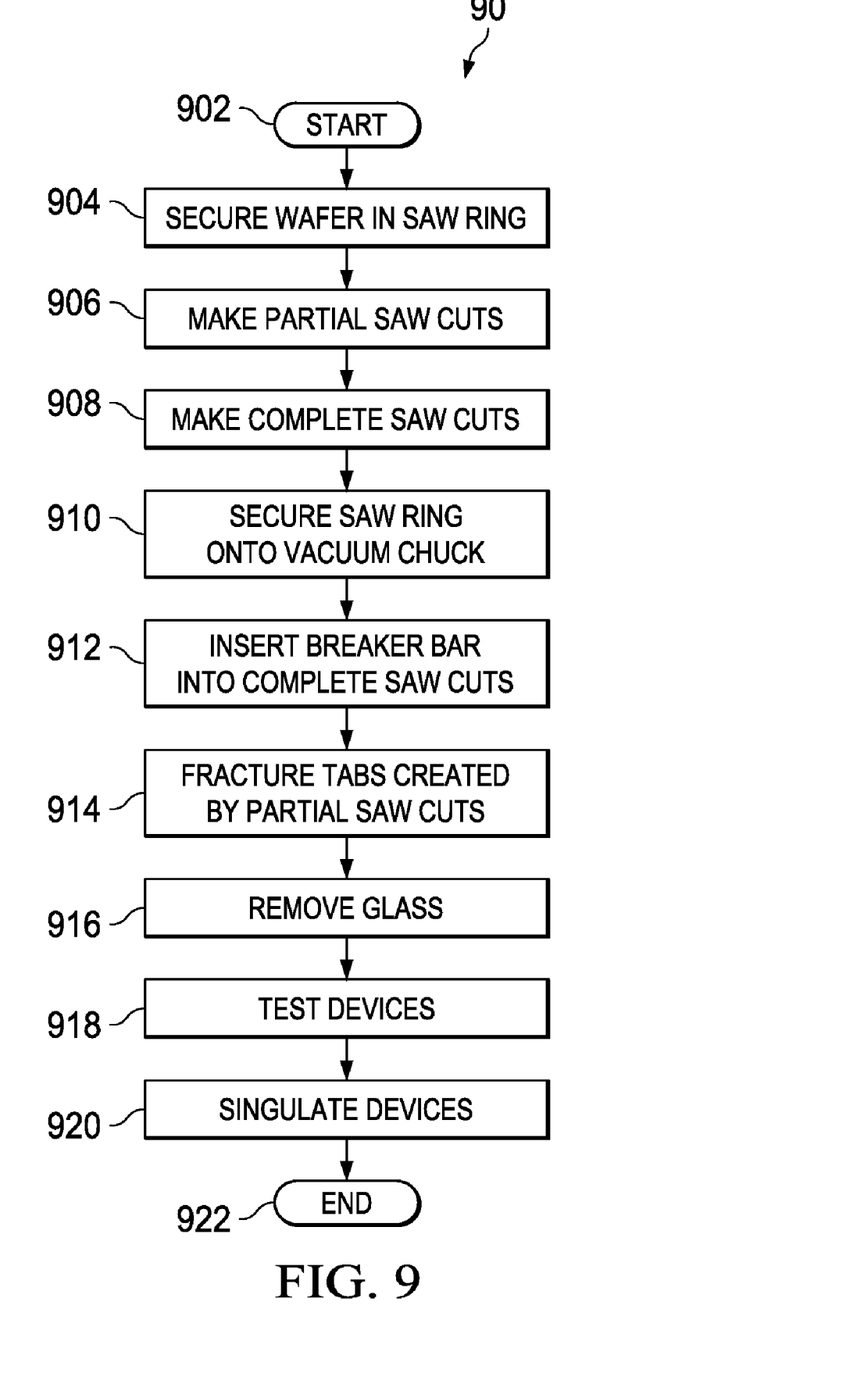
FIG. 9 is a process flow diagram depicting a process for gaining access to captive structures in a bonded wafer assembly.

Referring next to FIG. 9, there is shown a process 90 for removing superfluous glass from a bonded wafer assembly. The process begins at step 902. At step 904, the wafer is secured into a supporting saw ring as described hereinabove. At step 906, partial saw cuts are made partially through the top wafer of the bonded wafer assembly. Next, in step 908, a series of cuts are made completely through the top wafer of the bonded wafer assembly. In a typical embodiment, the cuts made in steps 906 and 908 will run in the same direction and be roughly parallel to each other resulting in, for example, a series of longitudinal cuts in the surface of the wafer. In one embodiment, the cuts may be made parallel to columns of contact zones disposed on a bottom wafer. The cutting steps in FIG. 9 may be performed in any order.

Still referring to FIG. 9, at step 910 the wafer and the saw frame are secured to a vacuum chuck. Next, at step 912 a breaker bar is inserted into the full saw cuts. The progressive insertion of the breaker bar induces the fracture of the tabs present in the partial saw cuts at step 914. The fracture of the tabs frees the superfluous glass and allows for its subsequent removal in step 916. The removal of the glass in step 916 is typically carried out by simply turning the wafer assembly over and letting gravity remove the cut glass. Alternatively, other methods for removing the cut glass may be used. One embodiment is a vacuum system that would remove the glass immediately upon the fracture of the tabs. Another embodiment is the use of a compressed gas. At step 918, each of the devices embedded in the bonded wafer assembly is tested and processed.

Still referring to FIG. 9, at step 920, following any desired testing and other processing, the devices are then completely singulated. This is typically accomplished by making complete saw cuts through the bottom wafer between each device pair and parallel to the cuts made in steps 906-908, as well as through both the top and the bottom wafers between each device pair in a direction roughly perpendicular to the cuts made in steps 906-908. Although this step typically takes place after all the devices are tested and processed, that need not always be the case. The process ends at step 922.

Overall, the swizzle stick removal process described herein may be performed only in a single direction, removing glass in either the columns or the rows. Alternatively, the process may be performed in both directions, removing glass in a grid pattern. Furthermore, the process may remove glass between all device columns or rows on a wafer, or only between some of the devices on the wafer. For example, if there are bond pads on only one side of a device, and adjacent devices have their bond pads proximate to each other, then only every other column between devices may be removed to provide access to the bond pads.

Although embodiments of the present invention and their advantages have been described in detail herein, it should be understood that various changes, substitutions and alterations can be made herein without departing from the spirit and scope of the invention as defined by the appended claims.

Moreover, the scope of the present application is not intended to be limited to the particular embodiments described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for removing material from a bonded wafer assembly comprising a top wafer bonded to a bottom wafer, the method comprising:
    cutting a plurality of parallel cuts in the top wafer, the plurality of cuts defining a segment of the top wafer attached to another portion of the top wafer via a tab;
    inserting a wedge-shaped breaker bar into at least one cut of the plurality of cuts;
    applying force to the breaker bar to fracture the tab; and
    removing the segment of the top wafer from the bonded wafer assembly, wherein the bottom wafer remains unsingulated after the removing.

2. The method of claim 1, wherein the removing the segment of the top wafer comprises utilizing a vacuum.

3. The method of claim 1, wherein the inserting of and the applying force to the breaker bar is performed by a machine.

4. The method of claim 3, further comprising aligning the breaker bar with the at least one cut with a visual alignment device.

5. The method of claim 1, further comprising mounting the bonded wafer assembly into a saw ring, the saw ring limiting a depth to which the breaker bar is inserted into the at least one cut.

6. The method of claim 5, further comprising securing the saw ring to a vacuum chuck and securing the bonded wafer assembly with the vacuum chuck.

7. The method of claim 1, further comprising repeating the cutting, the inserting, the applying and the removing to other areas of the top wafer.

8. A system for removing superfluous material from a bonded wafer assembly, the system comprising:
    a saw ring for holding a bonded wafer assembly comprising a top wafer and a bottom wafer, wherein the top wafer has a plurality of parallel cuts formed therein, and wherein the bottom wafer is unsingulated; and
    a breaker bar having a wedge profile shaped to be inserted into at least one cut of the plurality of cuts.

9. The system of claim 8, further comprising a vacuum chuck for removably securing the saw ring.

10. The system of claim 8, wherein the saw ring has a height that limits a depth to which the breaker bar can be inserted into the at least one cut.

11. The system of claim 10, wherein the height of the saw ring is above the bottom wafer and below a top surface of the top wafer.

12. The system of claim 8, further comprising multiple breaker bars for inserting into multiple cuts of the plurality of cuts at once.

13. The system of claim 8, further comprising a press for inserting the breaker bar into the at least one cut.

14. The system of claim 8, further comprising a controller for controlling the movement of the breaker bar.

15. The system of claim 13, further comprising a visual alignment device for aligning the breaker bar with the at least one cut.

16. A method for removing material from a bonded wafer assembly comprising a top wafer bonded to a bottom wafer, the method comprising:
    mounting the bonded wafer assembly in a saw ring, wherein the saw ring has a height higher than the lower wafer and lower than a top surface of the top wafer;
    cutting a plurality of parallel cuts in the top wafer, the plurality of cuts defining a segment of the top wafer attached to another portion of the top wafer via a tab;
    mounting the saw ring and the bonded wafer assembly in a vacuum chuck;
    applying a vacuum to secure the bonded wafer assembly;
    inserting a wedge-shaped breaker bar into at least one cut of the plurality of cuts;
    applying force to the breaker bar to break the tab; and
    removing the segment of the top wafer from the bonded wafer assembly, wherein the bottom wafer remains unsingulated after the removing.

17. The method of claim 16, wherein the step of removing the segment of the top wafer comprises utilizing a vacuum.

18. The method of claim 16, wherein the at least one cut extends through the top wafer, and wherein two other cuts of the plurality of cuts on either side of the at least one cut do not extend through the top wafer.

19. The method of claim 16, wherein the inserting of and the applying force to the breaker bar is performed by a machine.

20. The method of claim 19, further comprising aligning the breaker bar with the at least one cut with a visual alignment device.

* * * * *